United States Patent [19]
Dapper et al.

[11] Patent Number: 5,878,089
[45] Date of Patent: Mar. 2, 1999

[54] COHERENT SIGNAL DETECTOR FOR AM-COMPATIBLE DIGITAL AUDIO BROADCAST WAVEFORM RECOVERY

[75] Inventors: Mark J. Dapper, Cincinnati; Barry W. Carlin, Greenhills; Michael J. Geile, Batavia, all of Ohio

[73] Assignee: USA Digital Radio Partners, L.P., Columbia, Md.

[21] Appl. No.: 803,699

[22] Filed: Feb. 21, 1997

[51] Int. Cl.$^6$ ........................................ H03D 3/22
[52] U.S. Cl. ........................ 375/325; 329/304; 375/261
[58] Field of Search ................... 375/261, 268, 375/316, 320, 325, 344, 345; 329/304, 306, 347, 349

[56] References Cited

U.S. PATENT DOCUMENTS

| | | |
|---|---|---|
| 4,143,322 | 3/1979 | Shimamura . |
| 4,255,713 | 3/1981 | Yoshida . |
| 4,318,049 | 3/1982 | Mogensen . |
| 4,466,108 | 8/1984 | Rhodes . |
| 4,484,337 | 11/1984 | Leclert et al. . |
| 4,550,415 | 10/1985 | Debus, Jr. et al. . |
| 4,787,096 | 11/1988 | Wong . |
| 4,795,986 | 1/1989 | Ceroni et al. . |
| 4,843,583 | 6/1989 | White et al. . |
| 4,847,797 | 7/1989 | Picchi et al. . |
| 4,879,728 | 11/1989 | Tarallo . |
| 5,019,824 | 5/1991 | Kumar . |
| 5,113,142 | 5/1992 | Yoshikawa . |
| 5,148,451 | 9/1992 | Otani et al. . |
| 5,175,747 | 12/1992 | Murakami . |
| 5,214,671 | 5/1993 | Nakai . |
| 5,214,674 | 5/1993 | Sayegh . |
| 5,243,624 | 9/1993 | Paik et al. . |
| 5,247,543 | 9/1993 | Tsuda et al. . |
| 5,268,930 | 12/1993 | Sendyk et al. . |
| 5,448,590 | 9/1995 | Kostic . |

*Primary Examiner*—Jason Chan
*Assistant Examiner*—Congvan Tran

[57] ABSTRACT

A coherent signal detector for extracting analog and digital information from a received AM-compatible digital broadcast waveform is provided. The waveform can have an in-phase component and a quadrature component. The detector can include a down converter for shifting the in-phase and quadrature components in phase, frequency, or both, in response to a phase word, thereby providing a recovered in-phase output and a recovered quadrature output. The signal detector also includes an integration circuit for integrating a portion of the recovered quadrature output over a first preselected time interval, which can be one digital time frame.

29 Claims, 4 Drawing Sheets

COHERENT SIGNAL DETECTOR FOR AM-COMPATIBLE DIGITAL AUDIO BROADCAST WAVEFORM RECOVERY

BACKGROUND OF THE INVENTION

1. Field of the Invention

This invention relates to radio broadcasting and, more particularly, to a method of and apparatus for recovering an underlying digital broadcast signal from an amplitude-modulated broadcast carrier.

2. Description of the Related Art

There has been increasing interest in the possibility of broadcasting digitally encoded audio signals to provide improved audio fidelity. Several approaches have been suggested. One such approach, set forth in U.S. Pat. No. 5,588,022, and incorporated herein by reference, teaches a method for simultaneously broadcasting analog and digital signals in a standard AM broadcasting channel. An amplitude-modulated (AM) radio frequency (RF) signal having a first frequency spectrum is broadcast. The amplitude-modulated radio frequency signal includes a first carrier modulated by an analog program signal. Simultaneously, a plurality of digitally-modulated carrier signals are broadcast within a bandwidth which encompasses the first frequency spectrum. Each of the digitally-modulated carrier signals is modulated by a portion of a digital program signal. A first group of the digitally-modulated carrier signals lies within the first frequency spectrum and is modulated in quadrature with the first carrier signal. Second and third groups of the digitally-modulated carrier signals lie outside of the first frequency spectrum and are modulated both in-phase and in-quadrature with the first carrier signal. Both transmitters and receivers are provided in accordance with that method.

The waveform in the AM compatible digital audio broadcasting system described in U.S. Pat. No. 5,588,022, has been formulated to provide optimal data throughput for the digital signal while avoiding cross talk into the analog AM channel. Multiple carriers are employed by means of orthogonal frequency division multiplexing (OFDM) to bear the communicated information.

SUMMARY OF THE INVENTION

The invention provides a coherent signal detector for extracting analog and digital information from a received broadcast waveform, which can be an intermediate or RF frequency waveform. The waveform can have an in-phase component and a quadrature component. The detector can include a down converter for frequency and phase shifting the in-phase and quadrature components, thereby providing a recovered in-phase output and a recovered quadrature output. The recovered in-phase output generally has both analog and digital information therein, whereas the recovered quadrature output generally has digital information therein. The down converter can be responsive to a phase word for correction of recovered output phase. In addition, the phase word can include a frequency control word for compensating for frequency shifting in the down converter. Therefore, the phase word can be used to compensate for phase, frequency, or both. The signal detector also includes an integration circuit for integrating a portion of the recovered quadrature output over a first preselected time interval, thereby producing the phase word. It is preferred that the first preselected time interval be at least one digital time frame.

The signal detector also can include a signal conditioner. The signal conditioner can include an analog quadrature mixer that frequency shifts or phase shifts, or both, the received signal to produce outputs that are in phase quadrature to each other. In general, because the received signal is an analog signal, and the recovered in-phase and quadrature outputs are digital signals, the signal conditioner also includes an analog-to-digital converter for converting the analog signals into digital signals. The signal conditioner also can provide a low-pass filter coupled with the analog-to-digital converter for the filtering of the analog signals prior to digitization. The signal conditioner also can include an I/Q compensator which compensates for DC offsets, amplitude imbalances, phase mismatches, and combinations thereof.

The signal detector can have a received signal power detector for detecting a signal level representative of the received broadcast waveform power, thereby producing a power error signal. The received signal power detector can employ a square-law device for sensing the signal level. In general, the square-law device arithmetically squares the signal level, thereby producing a power value. The power detector also includes a power integrator for integrating the power value over a second preselected time interval, thereby producing the power error signal. The second preselected time interval is preferred to be at least one digital time frame. A gain control circuit can be used to maintain a gain control power signal within a predefined power range, in response to the power error signal.

In another embodiment according to the present invention herein, the coherent signal detector is similar in all respects to the first embodiment with the exception of the signal conditioner. The signal conditioner can optionally have a single analog mixer. The mixer receives the signal from the gain control circuit and frequency shifts or phase shifts, or both, to produce a signal output. The output is processed by a lowpass or bandpass (if undersampling is used) filter prior to conversion to a digital signal by an analog-to-digital converter. The digital signal is input to a quadrature digital down converter.

In another embodiment according to the invention herein, the coherent signal detector can include two serially-connected down converters. A signal conditioner similar to the previous embodiment also may be used. The first down converter can frequency shift the received waveform and produce in-phase and quadrature outputs. The second down converter can frequency and phase shift the in-phase and quadrature outputs, responsive to a phase word, thereby producing recovered in-phase and quadrature outputs. In this embodiment, an integration circuit can be connected to the second down converter for integrating a portion of the converted quadrature output over a first preselected time interval, thereby producing the phase word.

BRIEF DESCRIPTION OF THE DRAWINGS

The invention will be more readily apparent to those skilled in the art by reference to the accompanying drawings wherein.

DETAILED DESCRIPTION OF THE PREFERRED EMBODIMENT

This invention provides a coherent signal detector for extracting analog audio and digital information from a received broadcast waveform, which can be an intermediate or RF frequency waveform. In general, an AM-compatible digital audio broadcast (AM DAB) signal is sensed by a suitable radio-frequency receiver. The receiver converts the received AM DAB signal into a received broadcast waveform in which analog audio and digital information components are embedded, and provides this signal to a coherent signal detector according to the invention herein.

Figure 1:
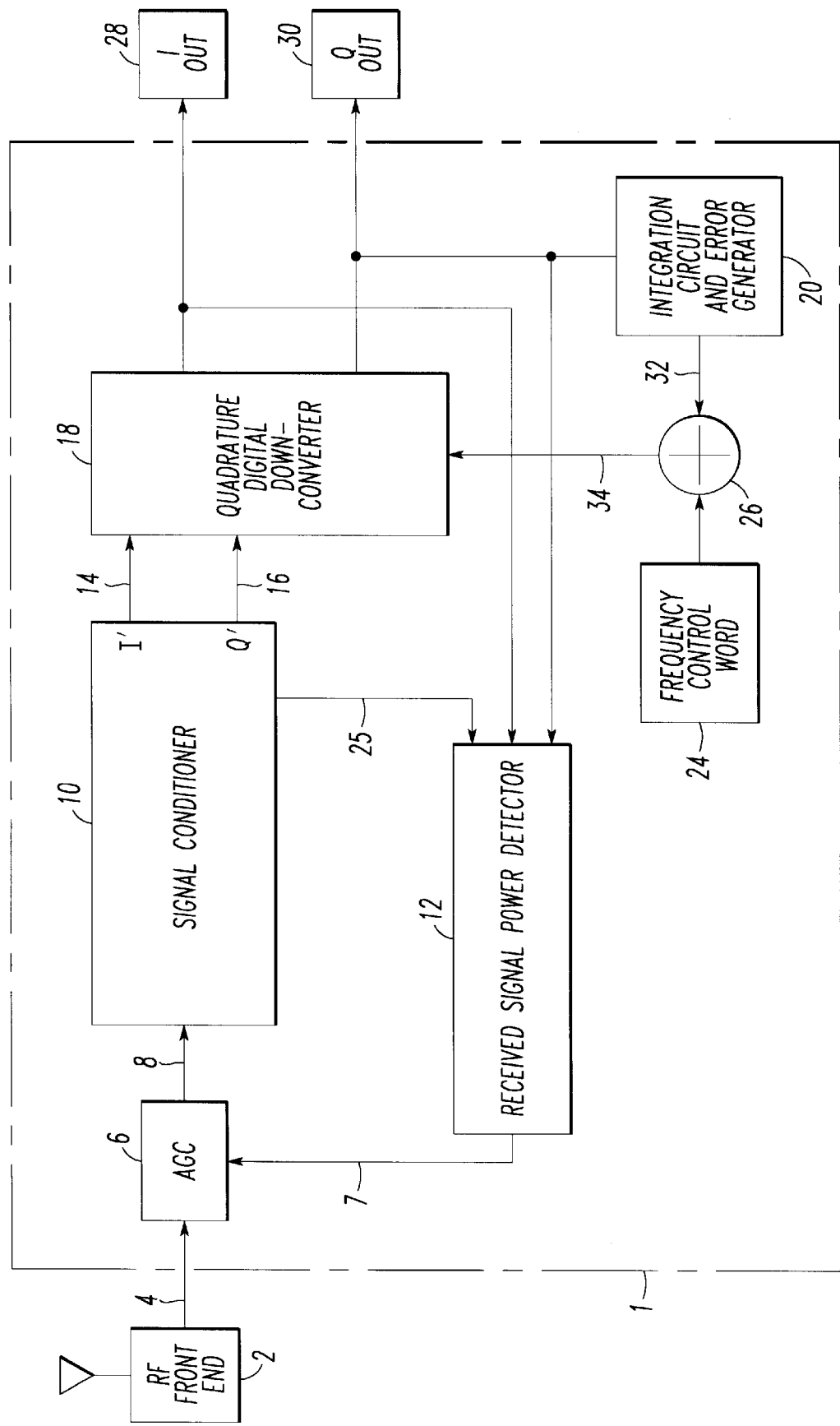
FIG. 1 is a diagram of an embodiment of the coherent signal detector according to the invention herein.

FIG. 1 is a block diagram of coherent signal detector 1 wherein receiver 2 detects received broadcast signal 4, having an AM carrier signal therein, and applies signal 4 to automatic gain control (AGC) circuit 6. Broadcast signal 4 can include an AM-compatible digital audio broadcasting signal which uses, for example, OFDM. AGC circuit 6 adjusts the power at AGC output 8 such that the power at AGC output 8 is maintained within a predefined power range. AGC circuit 6 is generally controlled by power error signal 7 from received power detector 12 that measures the power in the received broadcast signal 4.

AGC output 8 is received by I/Q signal conditioner 10. Within conditioner 10, in-phase (I') and quadrature (Q') signals are extracted from AGC output 8. Conditioner 10 can also compensate for DC offsets, amplitude imbalances, and phase mismatches that occur in the circuits that generate signals I' and Q'. Conditioner 10 also digitizes the aforementioned I' and Q' signals. As a result, conditioner 10 can produce conditioned in-phase (I') output 14 and conditioned quadrature (Q') output 16. However, conditioner 10 does not provide compensation to phase and frequency in order to lock them to the received AM carrier in received broadcast signal 4. Also conditioner 10 can provide at least one feedback signal 25 to detector 12 in order to give AGC circuit 6 a reference signal for gain control. Outputs 14 and 16 are input to quadrature digital down converter (QDDC) 18.

In general, QDDC 18 frequency and phase shifts I' output 14 and Q' output 16 from a first predetermined frequency to a second predetermined frequency thus resulting in recovered in-phase output signal 28 and recovered quadrature output signal 30. Although a frequency shift also can be performed for frequency alignment, the I' and Q' inputs to QDDC 18 may be very close to the desired frequency, in which case QDDC 18 may shift only phase so that in-phase and quadrature signals are in proper phase alignment with respect to the AM carrier signal. Although the first predetermined frequency can be an intermediate frequency, instead it may be an RF-band frequency. It is preferred that the second predetermined frequency be a baseband frequency. Q output signal 30 can be supplied to integration circuit 20 which integrates signal 30 over a first preselected time interval, which can be one digital time frame. Also, the preselected time interval can be an integral multiple of one digital time frame.

Integration circuit 20 can produce error signal 32 so that detector 1 can lock on to the phase and frequency of the AM carrier in received broadcast signal 4. If detector 1 has achieved both phase and frequency lock on the received AM carrier, the results of the integration should be approximately zero, because Q signal 30 contains primarily digital carriers whose frequencies are selected such that each carrier ideally integrates to zero over the duration of a preselected time interval of integration. It is preferred that the preselected interval be one data frame time, although an integral multiple thereof can be used.

If detector 1 is not in lock, some of the AM carrier signal and some of the transmitted I signal will be present in Q output signal 30. When these signals are integrated over the duration of the first preselected time interval, they may not integrate to zero and can be used to generate an error signal 32, which can be added in summer 26 with frequency control word 24, to produce phase word 34. Phase word 34 can be fed back to QDDC 18 and used to drive detector 1 into phase and frequency lock with the received AM carrier signal in signal 4. Frequency control word 24 is preferred to be a fixed value that represents the nominal frequency shift applied by QDDC 18.

Figure 2:
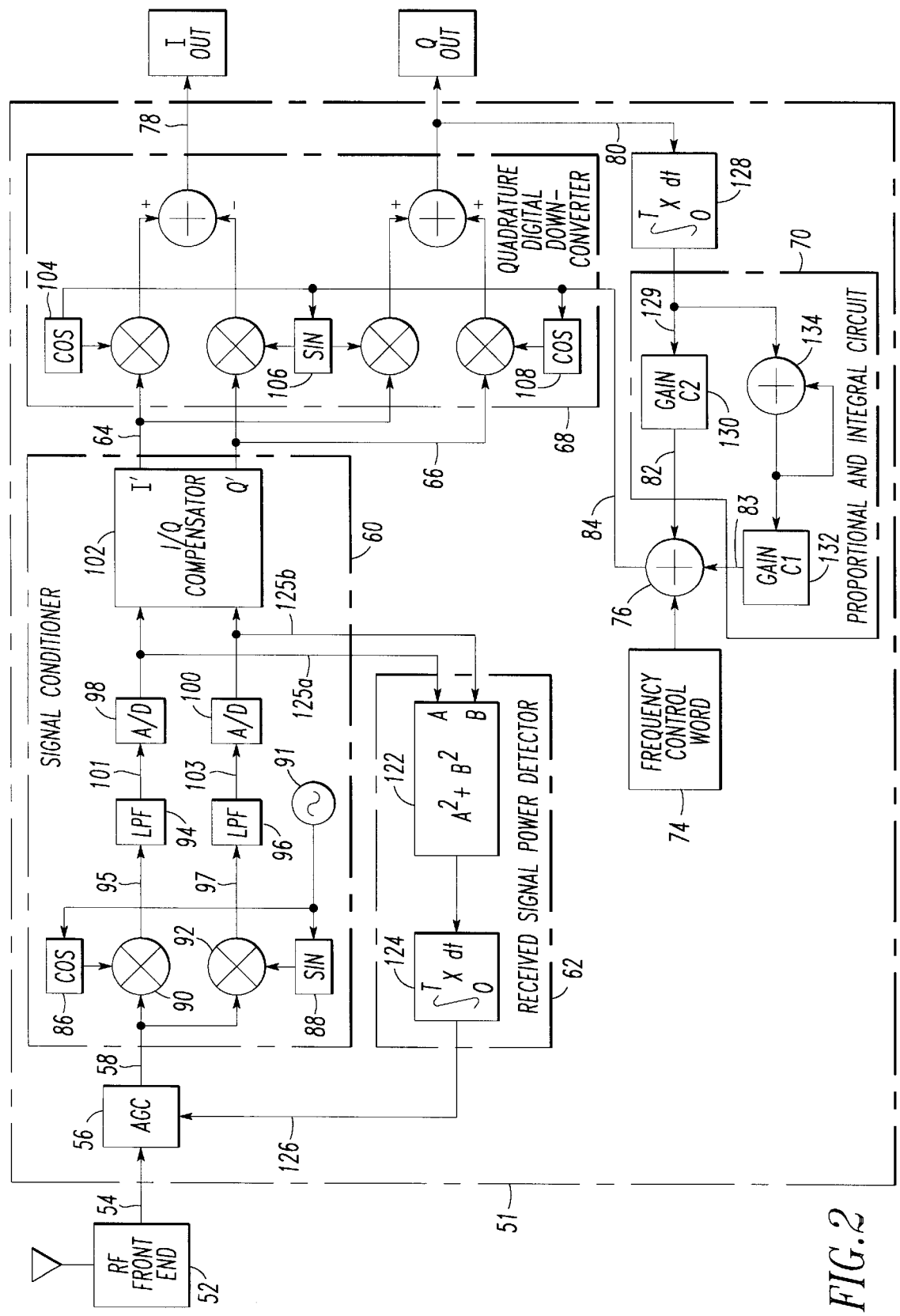
FIG. 2 is a diagram of a second embodiment of the coherent signal detector according to the invention herein.

In FIG. 2, coherent signal detector 51 illustrates another embodiment of the invention herein. Receiver 52 detects received broadcast signal 54, having an AM carrier signal therein, which is input into AGC circuit 56. Broadcast signal 54 can include an AM-compatible digital audio broadcasting signal which uses, for example, OFDM. AGC circuit 56 maintains AGC output 58 generally within a predefined power range using power error feedback which is preferred to be gain error signal 126. Signal conditioner 60 can receive AGC output 58 and generate at least one feedback signal 125*a,b* which is used by received power detector 62 to control AGC circuit 56.

In one embodiment of the present invention, received power detector 62 can include square-law device 122 and power integrator 124. However, any component that measures power in received signal 54 may also be employed. Device 122 squares and then sums each of signals 125*a,b* and provides the result to power integrator 124 for low-pass filtering. Integrator 124 produces gain error signal 126 which is used by AGC circuit 56 to maintain the power at AGC output 58 within the predefined power range. It is preferred that power integrator 124 integrate the output of device 122 for a second preselected time interval, which is preferred to be one digital time frame. Although signals 125*a,b* are shown as the input signals to power detector 62, input signals to detector 62 can also include AGC output 58; mixer outputs 95, 97; filter outputs 101, 103; I/Q compensator outputs 64, 66; QDDC outputs 78, 80; or a combination of these signals.

Similar to signal conditioner 10 in FIG. 1, signal conditioner 60 in FIG. 2 can extract I and Q signals from AGC output 58, and compensate for DC offsets, amplitude imbalances, and phase mismatches. However, conditioner 60 does not provide compensation to phase and frequency in order to lock them to the received AM carrier signal in received broadcast signal 54.

Conditioner 60 converts AGC output 58 into conditioned in-phase (I') output 64 and conditioned quadrature (Q') output 66. AGC output 58 can be received by first signal mixer 90 and second signal mixer 92 for signal separation into in-phase (I) and quadrature (Q) components, respectively. Mixers 90 and 92 can be used in conjunction with first cosine signal generator 86 and first sine signal generator 88, respectively, to convert the frequency of the respective I and Q signals to an intermediate frequency. Local oscillator 91 controls the frequency of generators 86, 88 but is not used to phase or frequency lock detector 51 to the AM carrier signal in received signal 54. In general, the frequency of local oscillator 91 is offset from the frequency of the received AM carrier in signal 54. Oscillator 91 can be a general purpose analog oscillator that may not produce a suitably stable signal. In the embodiment exemplified in FIG. 2, phase and frequency lock can be performed by QDDC 68 and proportional-and-integral (P-I) circuit 70.

The outputs of mixers 90, 92 can be received by low pass filters 94, 96, respectively, so that undesired frequency components produced by mixers 90, 92 can be minimized. In addition, low pass filters 94, 96 may also act as anti-aliasing filters for signal conditioning prior to signal conversion by analog-to-digital (A/D) converters 98, 100, respectively.

In one embodiment of the present invention, it is preferred that the output of A/D converters 98, 100 provide feedback signal 125 to received signal power detector 62. In addition, signals 64, 66 from I/Q compensator 102 could be used as inputs to detector 62, in place of inputs 125a,b. The outputs of A/D converters 98, 100 are received by I/Q compensator 102 which compensates for DC offsets, amplitude imbalances, and phase mismatches which may arise from other components associated therewith.

I' output 64 and Q' output 66 can be received by QDDC 68 to produce in-phase output 78 and quadrature output 80 by frequency shifting outputs 64 and 66 from a first preselected frequency range, which may be an intermediate or RF-band frequency range to a second preselected frequency range which is preferred to be a baseband frequency range. QDDC 68 also can rotate the phase of outputs 64 and 66, by a process commonly called carrier rotation. In general, the signals 64, 66 are represented as (I'+jQ'). In order to shift signals 64, 66 in frequency by $\omega_0$ and in phase by $\phi$, to produce output $S(\omega_0,\phi)$ where $S=I+jQ$, QDDC 68 implements:

$$S(\omega_0,\phi)=(I'+jQ')e^{j(\omega_0 t+\phi)}$$
$$=(I'+jQ')(\cos(\omega_0 t+\phi)+j\sin(\omega_0 t+\phi))$$
$$=I'\cos(\omega_0 t+\phi)-Q'\sin(\omega_0 t+\phi)+j(I'\sin(\omega_0 t+\phi)+Q'\cos(\omega_0 t+\phi))$$

Signal 84 can be representative of $(\omega_0 t+\phi)$.

Q output signal 80 can be supplied to frame interval integrator 128 for integration of the Q signal 80 over the first preselected time interval, which is preferred to be one digital time frame.

Similar to the error generation section of integration circuit 20 in FIG. 1, an error generation circuit, which can be P-I circuit 70, can produce error signal 84, so that detector 51 can lock on to the phase and frequency of the AM carrier signal. If detector 51 has achieved phase and frequency lock with the AM carrier, the output of integrator 128 generally should be zero, because Q output 80 contains only digital carriers, the frequency of which are such that each carrier integrates to essentially zero over the duration of one preselected time interval. The first preselected time interval is preferred to be one digital time frame. If detector 51 is not in phase and frequency lock, signal 80 will not integrate to zero over the duration of one digital time frame.

Error signal 129 can be applied to first proportional gain generator 130 which produces first proportional error signal 82. Similarly, signal 129 is supplied to integral gain generator consisting of signal summer 134 and gain circuit 132, the output of which is error signal 83. Gain circuits 130, 132 can be used to select the bandwidth of the loop that locks onto the phase and frequency of the AM carrier signal in received signal 54. First signal summer 76 sums frequency control word 74, first integral error 82, and second integral error signal 83 to produce phase word 84. Frequency control word 74 can be a fixed value that represents the nominal frequency shift applied by QDDC 68. Phase word 84 can be applied to signal generators 104, 106, 108 for the demodulation of signals 64, 66, and can be used to provide phase and frequency lock of detector 51 with the AM carrier signal in signal 54. Generators 104 and 108 can be the same device, and are shown as two devices in FIG. 2 for ease of drawing.

Generators 104, 106, and 108 may be table look-up type of circuits that generate the cosine and sine signals.

Figure 3:
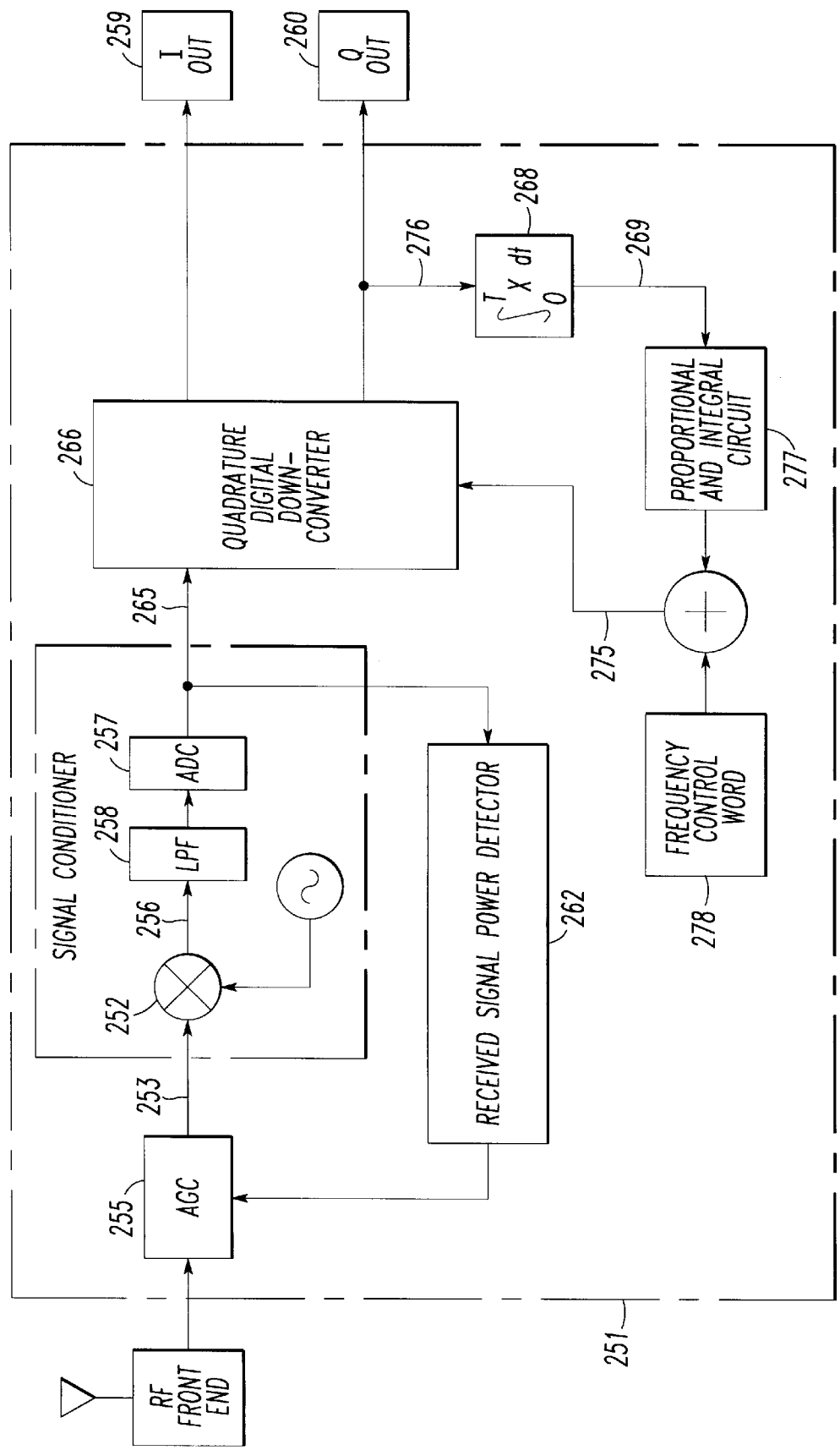
FIG. 3 is a diagram of a third embodiment of the coherent signal detector according to the invention herein.

In another embodiment of detector 251 according to the invention herein, as shown in FIG. 3, mixer 252 has one input signal 253 from AGC 255 and one output 256 to A/D converter 257. A low-pass filter 258 can be interposed between mixer 252 and A/D converter 257. Signal 253 is converted in frequency to an IF frequency which may be higher or lower than the desired carrier. The frequency conversion by mixer 252 can be used to, for example, reduce the frequency of the received signal 253 so that A/D converter 257 can sample signal 256 at an appropriate rate. The digitized output 265 from A/D converter 257 can be provided to QDDC 266, which can extract the desired in-phase component 259 and quadrature component 260. In yet another embodiment of detector 251, mixer 252 would not be used. Instead, signal 253 from AGC 255 could be provided directly to A/D converter 257, or if used, to filter 258, which may be a bandpass filter, prior to digitization by A/D converter 257. Although signal 265 is shown as the input signal to power detector 262, input signals to detector 262 can also include AGC output 253, mixer output 256, A/D converter output 265, and QDDC outputs 259, 260, or a combination of these signals. QDDC 266 can be configured to accept the single digitized signal 265 and extract signals 259, 260 therefrom. Phase word 275 is used to drive QDDC 266 into phase and frequency lock with received signal 253. Signal 276, circuit 268, signal 269, circuit 277, frequency control word 278, and phase word 275 in FIG. 3 are similar to signal 80, circuit 128, signal 129, circuit 70, frequency control word 74, and phase word 84, respectively in FIG. 2.

Figure 4:
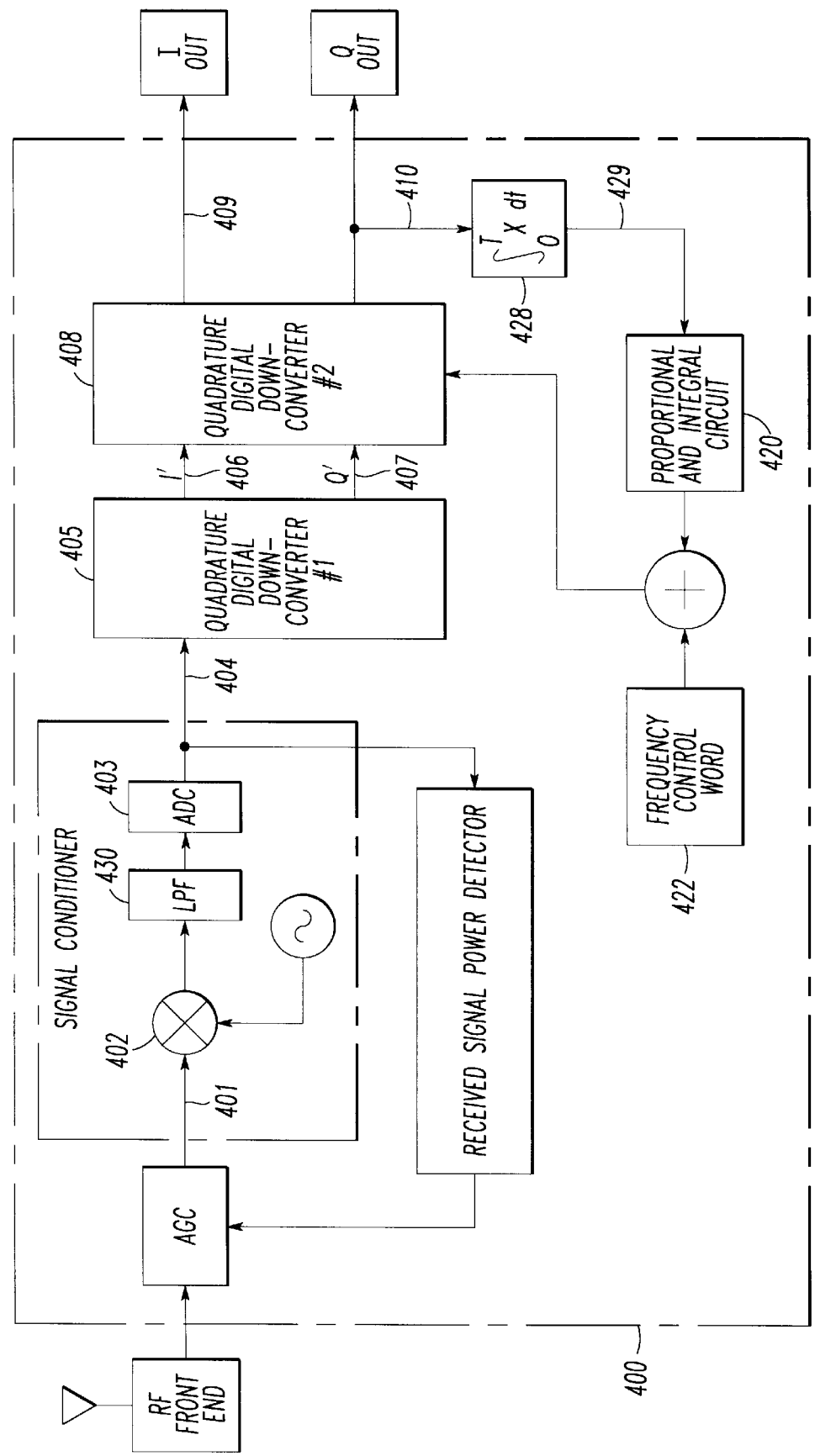
FIG. 4 is a diagram of a fourth embodiment of the coherent signal detector according to the invention herein.

In FIG. 4, yet another embodiment of detector 400 is disclosed. Received signal 401 can be input into mixer 402 and then into filter 430 followed by A/D converter 403. Alternatively, mixer 402 may be eliminated and received signal 401 may be input to filter 430 (which in this case may be a bandpass filter), and digitized directly by A/D converter 403. From converter 403, digitized program signal 404 can be received by QDDC1 405 where signal 404 is shifted in frequency to produce intermediate in-phase (I') and quadrature (Q') signal component 406 and 407, respectively. QDDC2 408 receives signals 406 and 407, and performs a frequency shift and a carrier rotation, or phase shift, on each of signals 406, 407 to produce respective desired in-phase and quadrature components 409, 410. QDDC2 408 may perform only a phase shift if signals 406, 407 are at the desired frequency.

Alternatively QDDC1 405 could be implemented using analog components and instead would be a "quadrature down converter" (QDC). Here, at least one A/D converter such as A/D converter 403 can be interposed between QDC 405 and QDDC2 408. Similar to circuits 268, 277 and 278 in FIG. 3, circuits 428, 420 and 422 maintain phase and frequency lock as desired values for signals 409, 410.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the invention which is to be given the full breadth of the following claims and any and all embodiments thereof.

We claim:

1. A coherent signal detector for extracting analog and digital information from a received broadcast waveform, said broadcast waveform having an in-phase component and a quadrature component, said coherent signal detector comprising:

(a) a down converter for frequency shifting said in-phase component and said quadrature component from a first preselected frequency range to a second preselected frequency range, said down converter providing a recovered in-phase output and a recovered quadrature output, said down converter being responsive to a phase word, said recovered in-phase output having generally said analog information and said digital information therein, said recovered quadrature output having generally said digital information therein; and (b) an integration circuit connected to said down converter, said integration circuit for integrating a portion of said recovered quadrature output over a first preselected time interval producing said phase word thereby, said phase word for correcting at least one of a frequency and a phase of said in-phase component and said quadrature component.

2. The sginal detector of claim 1 further comprising a signal conditioner for extracting within a first preselected frequency range an intermediate in-phase component and an intermediate quadrature component from said broadcast waveform.

3. The signal detector of claim 1 wherein said down converter phase-shifts said in-phase component and said quadrature component from a first preselected phase relationship to a second preselected phase relationship.

4. The signal detector of claim 2 wherein said intermediate in-phase and said intermediate quadrature components are analog signals, said recovered in-phase output and recovered quadrature output are digital signals and said signal conditioner further comprising an analog-to-digital converter for converting said analog signals into said digital signals.

5. The signal detector of claim 2 further comprising:

(a) a received signal power detector for detecting a signal level representative of the power of said received broadcast waveform, producing a power error signal thereby, said power detector being operably connected to said signal conditioner; and (b) a gain control circuit connected to said signal power detector, said circuit maintaining a gain control power signal within a predefined power range, responsive to said power error signal.

6. The signal detector of claim 2 wherein said signal conditioner further comprises an I/Q compensator for compensating one of a DC offset, an amplitude imbalance, a phase mismatch, and a combination thereof.

7. The signal detector of claim 1 wherein said down converter further comprises at least one of a frequency-shifter and a phase-shifter for converting at least one of said in-phase component and said quadrature component into respective said recovered in-phase output and said recovered quadrature output.

8. The signal detector of claim 1 wherein said phase word further comprises a frequency control word for compensating for said frequency shifting in said down converter.

9. The signal detector of claim 5 wherein said received signal power detector comprises:

(a) a square-law device for sensing said signal level, said device arithmetically squaring said signal level producing a power value thereby; and (b) a power integrator connected to said square-law device for integrating said power value over a second preselected time interval producing said power error signal thereby.

10. The signal detector of claim 4 further comprising:

(a) a received signal power detector for detecting a signal level representative of the power of said received broadcast waveform, producing a power error signal thereby, said power detector being operably connected to said signal conditioner; and (b) a gain control circuit connected to said signal detector, said circuit maintaining a gain control power signal within a predefined power range, responsive to said power error signal.

11. The signal detector of claim 10 wherein said signal conditioner further comprises an I/Q compensator for compensating one of a DC offset, an amplitude imbalance, a phase mismatch, and a combination thereof.

12. The signal detector of claim 11 wherein said down converter further comprises at least one of a frequency-shifter and a phase-shifter for converting at least one of said intermediate in-phase component and said intermediate quadrature component into respective said recovered in-phase output and said recovered quadrature output.

13. The signal detector of claim 12 wherein said phase word further comprises a frequency control word for compensating for said frequency shifting in said down converter.

14. The signal detector of claim 9 wherein said first preselected time interval is one digital time frame.

15. The signal detector of claim 9 wherein each of said first and second preselected time intervals is at least one digital time frame.

16. The signal detector of claim 4 wherein said signal conditioner further comprises a low-pass filter frequency coupled with said analog-to-digital converter.

17. A coherent signal detector for extracting analog and digital information from a received broadcast waveform, said broadcast waveform having an in-phase component and a quadrature component, said coherent signal detector comprising:

(a) a first down converter for frequency shifting said in-phase component and said quadrature component from a first preselected frequency range to a second preselected frequency range, said first down converter providing a recovered in-phase output and a recovered quadrature output;

(b) a second down converter operably connected to said first down converter, said second down converter receiving said recovered in-phase and quadrature outputs, said second down converter for at least one of frequency and phase shifting said recovered in-phase and quadrature outputs from a first preselected phase to a second preselected phase, said second down converter providing a converted in-phase output and a converted quadrature output, said second down converter being responsive to a phase word, said phase word for correcting at least one of a phase and a frequency of said recovered in-phase output and said recovered quadrature output; and (c) an integration circuit connected to said second down converter, said integration circuit for integrating a portion of said converted quadrature output over a first preselected time interval producing said phase word thereby.

18. The signal conditioner of claim 17 further comprising a signal conditioner for extracting an intermediate in-phase component and an intermediate quadrature component from said broadcast waveform.

19. The signal detector of claim 18 wherein said intermediate in-phase and said intermediate quadrature components are analog signals, said recovered in-phase output and recovered quadrature output are digital signals and said signal conditioner further comprising an analog-to-digital converter for converting said analog signals into said digital signals.

20. The signal detector of claim 18 further comprising:
(a) a received signal power detector for detecting a signal level representative of the power of said received broadcast waveform, producing a power error signal thereby, said power detector being operably connected to said signal conditioner; and
(b) a gain control circuit connected to said signal power detector, said circuit maintaining a gain control power signal within a predefined power range, responsive to said power error signal.

21. The signal detector of claim 17 wherein said down converter further comprises at least one of a frequency-shifter and a phase-shifter for converting at least one of said in-phase component and said quadrature component into respective said recovered in-phase output and said recovered quadrature output.

22. The signal detector of claim 17 wherein said phase word further comprises a frequency control word for compensating for said frequency shifting in said down converter.

23. The signal detector of claim 20 wherein said received signal power detector comprises:

(a) a square-law device for sensing said signal level, said device arithmetically squaring said signal level producing a power value thereby; and
(b) a power integrator connected to said square-law device for integrating said power value over a second preselected time interval producing said power error signal thereby.

24. The signal detector of claim 17 wherein said first preselected time interval is one digital time frame.

25. The signal detector of claim 23 wherein each of said first and second preselected time intervals is at least one digital time frame.

26. The signal detector of claim 17 wherein at least one of said first and second down converters is implemented in hardware.

27. The signal detector of claim 17 wherein at least one of said first and second down converters is implemented in software.

28. The signal detector of claim 17 wherein one of said first and second down converters is implemented in hardware and the other of said first and second down converters is implemented in software.

29. The signal detector of claim 19 wherein said signal conditioner further comprises a low-pass filter precedingly coupled with said analog-to-digital converter.

* * * * *

UNITED STATES PATENT AND TRADEMARK OFFICE
CERTIFICATE OF CORRECTION

PATENT NO. : 5,878,089
DATED : March 2, 1999
INVENTOR(S) : March J. Dapper, et al It is certified that error appears in the above-identified patent and that said Letters Patent is hereby corrected as shown below:

Column 7, line 21, "sginal" should read --signal--as originally submitted.

Signed and Sealed this

Twenty-eighth Day of November, 2000

Attest:

Q. TODD DICKINSON

*Attesting Officer*

*Director of Patents and Trademarks*